US012811264B2

(12) United States Patent
Takayanagi

(10) Patent No.: US 12,811,264 B2
(45) Date of Patent: Nov. 24, 2026

(54) BIASING CIRCUIT INCLUDING FIRST AND SECOND INDUCTORS HAVING RESPECTIVE CORES OF HIGH PERMEABILITY BULK MATERIAL

(71) Applicant: ADVANTEST CORPORATION, Tokyo (JP)

(72) Inventor: Fumikazu Takayanagi, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 192 days.

(21) Appl. No.: 18/854,694

(22) PCT Filed: May 31, 2022

(86) PCT No.: PCT/JP2022/022155
§ 371 (c)(1),
(2) Date: Oct. 7, 2024

(87) PCT Pub. No.: WO2023/233530
PCT Pub. Date: Dec. 7, 2023

(65) Prior Publication Data

US 2025/0266799 A1 Aug. 21, 2025

(51) Int. Cl.
*H01P 1/20* (2006.01)
*H03H 7/01* (2006.01)
*H01F 3/10* (2006.01)

(52) U.S. Cl.
CPC ......... *H01P 1/2007* (2013.01); *H03H 7/0138* (2013.01); *H03H 7/0184* (2013.01);
(Continued)

(58) Field of Classification Search
CPC .. H01P 1/2007; H03H 7/0184; H03H 7/0138; H03H 7/17; H03H 7/1741
(Continued)

(56) References Cited

U.S. PATENT DOCUMENTS

2007/0063771 A1* 3/2007 Pan et al. .............. H01P 1/2007 330/149
2007/0164843 A1 7/2007 Yagisawa et al.
(Continued)

FOREIGN PATENT DOCUMENTS

EP 3486926 A1 5/2019
JP H03-013501 A 1/1991
(Continued)

OTHER PUBLICATIONS

International Search Report Issued in International Patent Application No. PCT/JP2022/022155, dated Aug. 23, 2022, along with an English translation thereof.
(Continued)

*Primary Examiner* — Benny T Lee
(74) *Attorney, Agent, or Firm* — GREENBLUM & BERNSTEIN, P.L.C.

(57) ABSTRACT

A biasing circuit includes a signal input terminal, a signal output terminal, a first inductor, and a second inductor. The first inductor is with one end connected to a node between the signal input terminal and the signal output terminal. The second inductor is with one end connected to an other end of the first inductor. The first inductor includes a core that is formed by a bulk of ferrite. The second inductor includes a core that is formed by a bulk of high permeability material.

8 Claims, 1 Drawing Sheet

(52) U.S. Cl.
CPC ............ *H03H 7/17* (2013.01); *H03H 7/1741* (2013.01); *H01F 2003/106* (2013.01)

(58) Field of Classification Search
USPC .......................................................... 333/181
See application file for complete search history.

(56) References Cited

U.S. PATENT DOCUMENTS

| | | | |
|---|---|---|---|
| 2018/0131330 | A1 | 5/2018 | Itabashi |
| 2019/0108939 | A1 | 4/2019 | Fujimoto et al. |

FOREIGN PATENT DOCUMENTS

| | | | |
|---|---|---|---|
| JP | H04-084510 | A | 3/1992 |
| JP | H07-183766 | A | 7/1995 |
| JP | 2000-151324 | A | 5/2000 |
| JP | 2004-040444 | A | 2/2004 |
| JP | 2007-109839 | A | 4/2007 |
| JP | 2018-078495 | A | 5/2018 |
| JP | 2020-195009 | A | 12/2020 |
| JP | 2021-010112 | A | 1/2021 |
| JP | 2021-097198 | A | 6/2021 |

OTHER PUBLICATIONS

Taiwan Office Action for App. No. 112108282, dated Dec. 15, 2023, along with an English translation thereof.

* cited by examiner

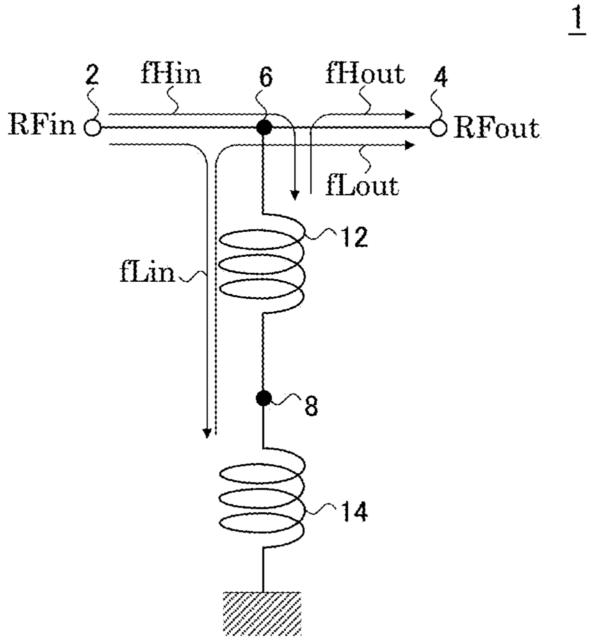
1
2
fHin
6
fHout
4
RFin
RFout
fLout
12
fLin
8
14

BIASING CIRCUIT INCLUDING FIRST AND SECOND INDUCTORS HAVING RESPECTIVE CORES OF HIGH PERMEABILITY BULK MATERIAL

TECHNICAL FIELD

The present invention relates to a biasing circuit.

BACKGROUND ART

There have conventionally been known bias tees in which one end of an inductor is connected to a node between a signal input terminal and a signal output terminal, while the other end of the inductor is grounded. The core of the inductor is formed by solidifying powder of high permeability material with carbon binder or by ferrite of high resistance material to reduce eddy current loss.

It is noted that Patent Literatures 1 and 4 each describe a biasing circuit. Also, Patent Literatures 2 and 3 each describe a filter.

CITATION LIST

Patent Literature

Patent Literature 1: Japanese Patent Application Publication No. 2018-078495 (Publication Date: 17 May 2018)
Patent Literature 2: Japanese Patent Application Publication No. 2004-040444 (Publication Date: 5 Feb. 2004)
Patent Literature 3: Japanese Patent Application Publication No. 2000-151324 Publication Date: 30 May 2000)
Patent Literature 4: Japanese Patent Application Publication No. H7-183766 (Publication Date: 21 Jul. 1995)

SUMMARY OF THE INVENTION

Technical Problem

However, the core of such an inductor, formed by solidifying powder of high permeability material with carbon binder or by ferrite of high resistance material as described in the related arts above, can suffer from a reduction in the permeability and therefore a reduction in the inductance. This can cause the frequency band on the low-frequency side of the output of the signal output terminal to become narrower.

It is hence an object of the present invention to widen the frequency band on the low-frequency side of the output of a biasing circuit.

Means for Solving the Problem

According to a first aspect of the present invention, a biasing circuit includes: a signal input terminal; a signal output terminal; a first inductor with one end connected to a node between the signal input terminal and the signal output terminal; and a second inductor with one end connected to an other end of the first inductor, wherein the first inductor includes a core that is formed by ferrite bulk material, and the second inductor includes a core that is formed by high permeability material bulk material.

According to the thus constructed first aspect of biasing circuit, a first inductor is with one end connected to a node between the signal input terminal and the signal output terminal. A second inductor is with one end connected to an other end of the first inductor. The first inductor includes a core that is formed by ferrite bulk material. The second inductor includes a core that is formed by high permeability material bulk.

According to a second aspect of the present invention, a biasing circuit includes: a signal input terminal; a signal output terminal; a first inductor with one end connected to a node between the signal input terminal and the signal output terminal; and a second inductor with one end connected to an other end of the first inductor, wherein the first inductor includes a core that is formed by molding powder of high permeability material with carbon binder, and the second inductor includes a core that is formed by high permeability material bulk material.

According to the thus constructed second aspect of biasing circuit, a first inductor is with one end connected to a node between the signal input terminal and the signal output terminal. A second inductor is with one end connected to an other end of the first inductor. The first inductor includes a core that is formed by molding powder of high permeability material with carbon binder. The second inductor includes a core that is formed by high permeability material bulk material.

According to the biasing circuit of the first and the second aspects of the present invention, the high permeability material may have a specific permeability of higher than 500.

According to the biasing circuit of the first and the second aspects of the present invention, the other end of the second inductor may be grounded.

According to the biasing circuit of the second aspect of the present invention, the core of the first inductor may be formed by molding powder of iron, iron-based nanocrystallized material, high-purity iron, permendur, or silicon steel with carbon binder.

According to the biasing circuit of the first and the second aspects of the present invention, the core of the second inductor may be formed by pure iron, amorphous magnetic bulk material, iron-based nanocrystallized bulk material, high-purity bulk iron, bulk permendur, bulk silicon steel, bulk permalloy, or bulk supermalloy.

BRIEF DESCRIPTION OF THE DRAWINGS

FIG. 1 is a circuit diagram showing a biasing circuit according to an embodiment of the present invention.

MODES FOR CARRYING OUT THE INVENTION

A description will now be given of an embodiment of the present invention referring to drawings.

FIG. 1 is a circuit diagram showing a biasing circuit 1 according to an embodiment of the present invention. The biasing circuit 1 according to the embodiment of the present invention includes a signal input terminal (RFin) 2, a signal output terminal (RFout) 4, nodes 6, 8, a first inductor 12, and a second inductor 14. The biasing circuit 1 according to the embodiment of the present invention is a bias tee.

A signal (e.g. high frequency signal) is input to the signal input terminal (RFin) 2. A signal (e.g. high frequency signal) is output from the signal output terminal (RFout) 4. The node 6 is provided between the signal input terminal 2 and the signal output terminal 4.

One end of the first inductor 12 is connected to the node 6. The other end of the first inductor 12 and one end of the second inductor 14 are connected to the node 8. Accordingly, the other end of the first inductor 12 is connected with the one end of the second inductor 14. Also, the other end of the second inductor 14 is grounded.

It is noted that the first inductor 12 and the second inductor 14 each serve as a low pass filter. The cutoff frequency of the first inductor 12 is higher than the cutoff frequency of the second inductor 14.

The first inductor 12 includes a core that is formed by ferrite bulk material or by molding powder of high permeability material (e.g. iron, iron-based nanocrystallized material, high-purity iron, permendur, or silicon steel) with carbon binder.

The second inductor 14 includes a core that is formed by high permeability bulk material (e.g. pure iron, amorphous magnetic material, iron-based nanocrystallized material, high-purity iron, permendur, silicon steel, permalloy, or supermalloy).

It is noted that the high permeability material above means material that is sensitively magnetized by an external magnetic field and has, for example, a specific permeability of higher than 500.

Next will be described an operation according to the embodiment of the present invention.

A signal that has a high frequency component fHin and a low frequency component fLin is input to the signal input terminal (RFin) 2. It is noted that the cutoff frequency of the first inductor 12 is lower than the frequency of the high frequency component fHin but higher than the frequency of the low frequency component fLin. On the other hand, the cutoff frequency of the second inductor 14 is lower than the frequency of the low frequency component fLin.

The high frequency component fHin passes through the node 6, provided to and reflected by the first inductor 12, and output as a high frequency component fHout from the signal output terminal (RFout) 4. Here, the core of the first inductor 12 is formed by ferrite bulk material or by molding powder of high permeability material with carbon binder and thereby undergoes reduced eddy current loss.

The low frequency component fLin passes through the node 6 and the first inductor 12, provided to and reflected by the second inductor 14, passes through the first inductor 12 and the node 6, and output as a low frequency component fLout from the signal output terminal (RFout) 4.

In accordance with the embodiment of the present invention, the core of the first inductor 12 is formed by ferrite bulk material or by molding powder of high permeability material with carbon binder and thereby undergoes reduced eddy current loss.

Additionally, in accordance with the embodiment of the present invention, the core of the second inductor 14, which is formed by a high permeability bulk material, can have higher permeability and therefore higher inductance, whereby the inductor can have a lower cutoff frequency, compared to the core of the first inductor 12, which is formed by ferrite bulk material or by molding powder of high permeability material with carbon binder.

In addition, since a component with a frequency higher than the cutoff frequency of the second inductor 14 is reflected by the second inductor 14 and output from the signal output terminal (RFout) 4, the frequency band on the low-frequency side of the output of the biasing circuit 1 becomes wider as the second inductor 14 has a lower cutoff frequency.

That is, in accordance with the embodiment of the present invention, since the second inductor 14 can have a lower cutoff frequency, the frequency band on the low-frequency side of the output of the biasing circuit 1 can become wider.

Note here that if a current flowed through the second inductor 14, the eddy current loss in the second inductor 14 would be increased. However, since the low frequency component fLin is reflected by the second inductor 14, no current substantially flows through the second inductor 14. The eddy current loss in the second inductor 14 can therefore be reduced (even though, unlike the first inductor 12, the core is not formed by ferrite bulk material or by molding powder of high permeability material with carbon binder).

DESCRIPTION OF REFERENCE NUMERALS

1 Biasing Circuit
2 Signal Input Terminal (RFin)
4 Signal Output Terminal (RFout)
6, 8 Nodes
12 First Inductor
14 Second Inductor
MHin, fHout High Frequency Component
fLin, fLout Low Frequency Component

The invention claimed is:

1. A biasing circuit, comprising:
a signal input terminal;
a signal output terminal;
a first inductor with one end connected to a node between the signal input terminal and the signal output terminal; and
a second inductor with one end connected to an other end of the first inductor, wherein
the first inductor includes a core that is formed by a ferrite bulk material,
the second inductor includes a core that is formed by a high permeability bulk material, and
the high permeability bulk material has a specific permeability higher than 500.

2. The biasing circuit according to claim 1, wherein
the other end of the second inductor is grounded.

3. The biasing circuit according to claim 1, wherein
the high permeability bulk material is composed of pure iron, amorphous magnetic material, iron-based nanocrystallized material, high-purity iron, permendur, silicon steel, permalloy, or supermalloy.

4. A biasing circuit, comprising:
a signal input terminal;
a signal output terminal;
a first inductor with one end connected to a node between the signal input terminal and the signal output terminal; and
a second inductor with one end connected to an other end of the first inductor, wherein
the first inductor includes a core that is formed by molding powder of high permeability material with carbon binder,
the second inductor includes a core that is formed by high permeability bulk material, and
the high permeability bulk material has a specific permeability higher than 500.

5. The biasing circuit according to claim 4, wherein
the high permeability material is composed of iron, iron-based nanocrystallized material, high-purity iron, permendur, or silicon steel.

6. The biasing circuit according to claim 4, wherein
the other end of the second inductor is grounded.

7. The biasing circuit according to claim 4, wherein
the high permeability bulk material is composed of pure iron, amorphous magnetic material, iron-based nanocrystallized material, high-purity iron, permendur, silicon steel, permalloy, or supermalloy.

8. A biasing circuit producing method, wherein a biasing circuit includes a signal input terminal, a signal output terminal, a first inductor with one end connected to a node between the signal input terminal and the signal output terminal, and a second inductor with one end connected to an other end of the first inductor, wherein the second inductor includes a core that is formed by high permeability bulk material, said biasing circuit producing method comprising:

molding powder of high permeability material with carbon binder to form a core of the first inductor.

* * * * *